(12) United States Patent
Chiu

(10) Patent No.: US 7,068,270 B1
(45) Date of Patent: Jun. 27, 2006

(54) DESIGN OF INTEGRATED CIRCUIT PACKAGE USING PARAMETRIC SOLIDS MODELLER

(75) Inventor: Anthony M. Chiu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/348,703

(22) Filed: Dec. 2, 1994

(51) Int. Cl.
*G06T 17/00* (2006.01)

(52) U.S. Cl. .................................... 345/420
(58) Field of Classification Search ................ 395/120; 364/495, 488–91; 703/1, 6, 7, 13, 2; 438/15; 345/420, 619, 689
See application file for complete search history.

(56) References Cited

U.S. PATENT DOCUMENTS

| | | | | |
|---|---|---|---|---|
| 4,613,940 A | * | 9/1986 | Shenton et al. ................. 716/8 |
| 4,651,284 A | * | 3/1987 | Watanabe et al. ........... 364/491 |
| 4,701,778 A | * | 10/1987 | Aneha et al. ................. 257/207 |
| 4,744,084 A | * | 5/1988 | Beck et al. ..................... 714/33 |
| 4,809,308 A | * | 2/1989 | Adams et al. .............. 378/98.2 |
| 4,922,432 A | * | 5/1990 | Kobayashi et al. .......... 364/490 |
| 4,937,827 A | * | 6/1990 | Beck et al. ..................... 714/33 |
| 4,942,550 A | * | 7/1990 | Murray ......................... 395/282 |
| 5,031,111 A | * | 7/1991 | Chao et al. .................. 364/491 |
| 5,282,146 A | * | 1/1994 | Aihara et al. ................. 716/11 |
| 5,293,479 A | * | 3/1994 | Quintero et al. ............ 395/161 |
| 5,309,223 A | * | 5/1994 | Konicek et al. ............. 356/621 |
| 5,452,238 A | * | 9/1995 | Kramer et al. .............. 364/578 |
| 5,477,138 A | * | 12/1995 | Erjavic et al. ........... 324/158.1 |
| 5,579,249 A | * | 11/1996 | Edwards ........................ 703/2 |
| 5,621,811 A | * | 4/1997 | Roder et al. ................. 382/147 |

OTHER PUBLICATIONS

Conway et al.; *An Automatic Layout Generator for Analog Circuits*; 1992; pp. 513-519, Mar. 1992.*
Natarajan et al.; *nOHM—A Multi-Process Device Synthesis Tool for Lateral DMOS Structures*; 1994; pp. 323-327, Sep. 1994.*
Choi. S.-G., et al, "Three-Step Pin Assignment Algorithm for Building Block Layout", *Electronic Letters*, vol. 28, iss. 20, Sep. 28, 1992, pp. 1882-1884.*
Lin, Z.-M., et al, "An Efficient Relative Placement Algorithm for Custom Chip Design", *Custom Integrated Circuits Conference*, 1990, pp. 27.1.1-27.1.4.*
Caggiano, A PC Program that Generates a Model of the Parasitics for IC Packages, IEEE Electronic Components and Technology Conference, 1994. Proceedings, 44th, pp. 683-686.*

(Continued)

*Primary Examiner*—Richard Hjerpe
*Assistant Examiner*—Motilewa Good-Johnson
(74) *Attorney, Agent, or Firm*—Yingsheng Tung; Wade James Brady, III; Frederick J. Telecky, Jr.

(57) ABSTRACT

A computer is used to model objects by accepting commands from a user. The object is altered in response to the commands. Dimensions are formed between the features, and relations between the dimensions are formed in order to present inconsistence relations which prevent the object from being modeled.

14 Claims, 4 Drawing Sheets

OTHER PUBLICATIONS

Just et al., On the relative placement and the transportation problem for standard-cell layout, 1986 IEEE 23$^{rd}$ Design Automation Conference, pp. 308-313.*

Chao et al., Signal integrity optimizaiton on the pad assignment for high-speed VLSI design, ACM, pp. 1-6.*

Haynie, Tutorial: the relational data model for design automation, 1983 IEEE 20$^{th}$ Design Automation Conference, pp. 599-607.*

* cited by examiner

DESIGN OF INTEGRATED CIRCUIT PACKAGE USING PARAMETRIC SOLIDS MODELLER

TECHNICAL FIELD OF THE INVENTION

This invention relates to modeling and more particularly to lead frame design and the design of integrated circuit packages.

BACKGROUND OF THE INVENTION

The Pro/Engineer® is a software module that may be implemented on a, for example, a personal computer. The Pro/Engineer® provides, on a computer, mechanical engineering automation tools that are based on a parametric, feature-driven solid modeling technology. The Pro/Engineer® is driven by providing common features, for example hole, slotfillet, chamfer. The Pro/Engineer® is parametric in the sense that parameters may equal the dimensions, number of features in a pattern, loads, boundary conditions, etc. Additionally, the Pro/Engineer® is sufficiently flexible so that the design intent may be captured through relations, for example, relations or relationships between features on a part, between parts in an assembly, between loads/boundary conditions feature parameters, for example surface area. The Pro/Engineer® supports the creation of large, complex assemblies, for example table-driven families of assemblies. The Pro/Engineer® is based on workstation technology in that the results may be displayed on the screen of the workstation. The Pro/Engineer® is a menu-driven modeler to provide three dimensional colored solids or wireframe models. With Pro/Engineer®, the models may be viewed on a screen, plotted on a paper, plotters or output to a color Post Script® printer.

Various electronic products such as stereos, TVs and personal computers use more than fifty percent of the total semiconductors produced around the world. These products generally have a short product lifecycle, for example, averaging between six to eighteen months. And, many of these products require specialized integrated circuits (IC) with application-specific packages. These short product life cycles of these products have created shorter IC packaging development cycle for the IC suppliers in order to produce these specialized ICs and associated packages.

The conventional design and develop methodology for an IC package is based on a series of sequential steps. First, an outline drawing is made using a pencil and paper, or alternatively, a computer aided design (CAD) tool. Second, drawings are made by using this outline drawing. Tooling is fabricated from the tooling drawings to verify that the produced package from these tools matches the outline drawing. If the package does not match the outline due to discrepancies between the tooling design and the package outline, then the tooling is modified to produce the desired package. The third step is assembling a test lot using live or actual integrated circuits to substantiate that the package is in fact manufacturable and functional. Fourth, a series of reliability tests are run on the new package to verify that the new package meets the manufacture's or user's requirements.

SUMMARY OF THE INVENTION

The present invention includes a method for producing a model that meets predetermined criteria, such as mechanical outline dimensions. The present invention prevents a modeling tool from attempting to satisfy constraints which cannot be satisfied. Particularly, when modeling a physical device, there are boundary conditions dictated by the physical characteristics of the device, that, when violated, render the model meaningless. These boundary conditions may be expressed as relationships of features of the device to be modeled.

The present invention includes a machine for displaying an object having features for modeling including, input circuitry to input commands from a user to model the object, altering circuitry to accept the commands from the user and to alter the object in accordance with the commands, dimension circuitry to form dimensions between the features, relation circuitry to form relations between the features through the dimensions, wherein the relations circuitry compares the relations to determine an inconsistent relation which prevents the object from being modeled.

DETAILED DESCRIPTION OF THE INVENTION

Before the boundary conditions can be specified for a device, the physical characteristics of the device should be modeled. The physical characteristics are modeled by using the Pro/Engineer®. The user builds a predetermined set of features of the model such as rectangular, slots, etc. and arranges these features to display the object to be modeled. The user subsequently modifies the predetermined features through the keyboard or the mouse in order to achieve the desired physical characteristics.

Figure 1:
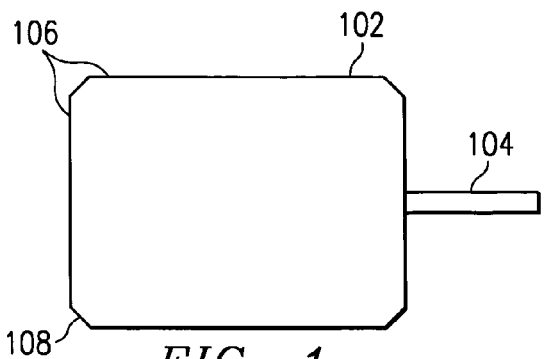
FIG. 1 is a top view of a partially designed integrated circuit package.
Figure 2:
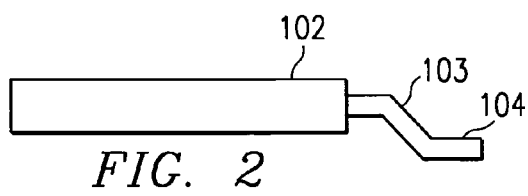
FIG. 2 is a side view of the partially designed integrated circuit package.
Figure 3:
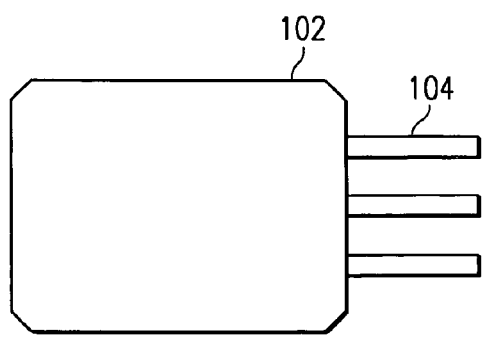
FIG. 3 is a top view of another designed integrated circuit package.
Figure 4:
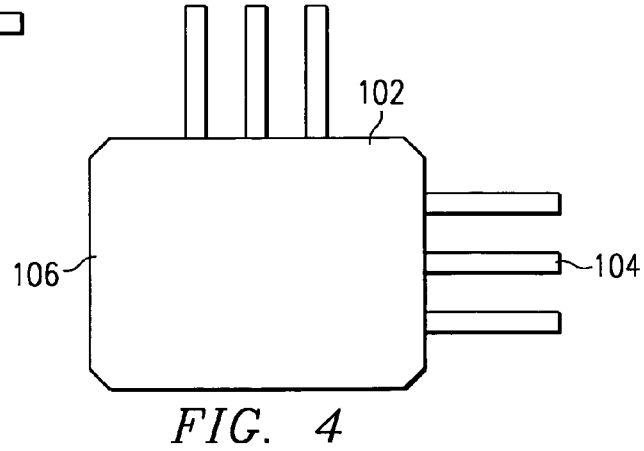
FIG. 4 is a top view of a further designed integrated circuit package.
Figure 5:
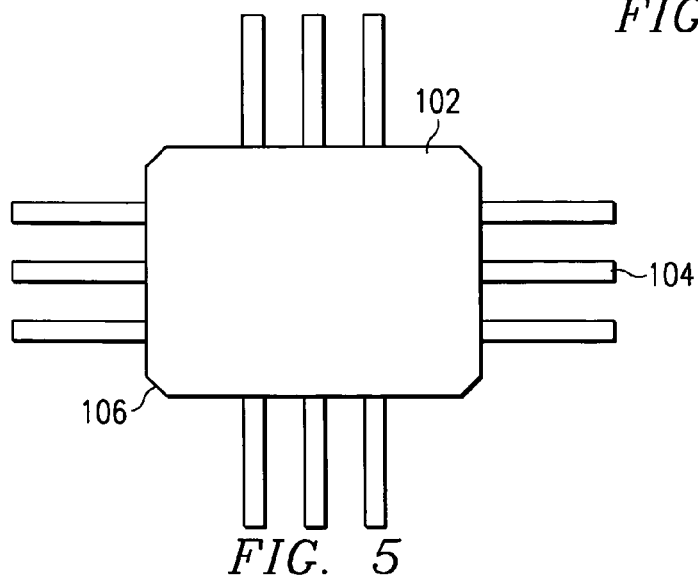
FIG. 5 is a top view of a fully designed integrated circuit package.

FIGS. 1–5 illustrate the procedure for creating the design of the integrated circuit package using the Pro/Engineer® modeling software. FIG. 1 illustrates that a body 102 is formed of edges 106. The body may include chamfered edges 108 to eliminate the corners of the body 102. Although the body 102 is shown in 2 dimensions, the body may be extended to 3 dimensions to create a 3 dimensional geometry. Additionally, a lead 104 is connected to the body 102. The lead may be centered on an edge 106 of body 102 as illustrated in FIG. 1. The lead 104 may include angle section 103 such that the lead 104 supports the body 102 at a position above the printed circuit board (not shown) to which the lead 104 may be connected. As illustrated in FIG. 3, additional leads 104 may be attached to an edge 106 of the body. These leads are copied from position to position along the edge using the pattern commands with the Pro/Engineer®. Furthermore, as illustrated in FIG. 4, the additional lead 104 may be connected to the edge substantially perpendicular to the original edge by using a mirroring command in Pro/Engineer®. Thus, the result is that the leads are positioned around all the edges 106 of the body 102.

Figure 6:
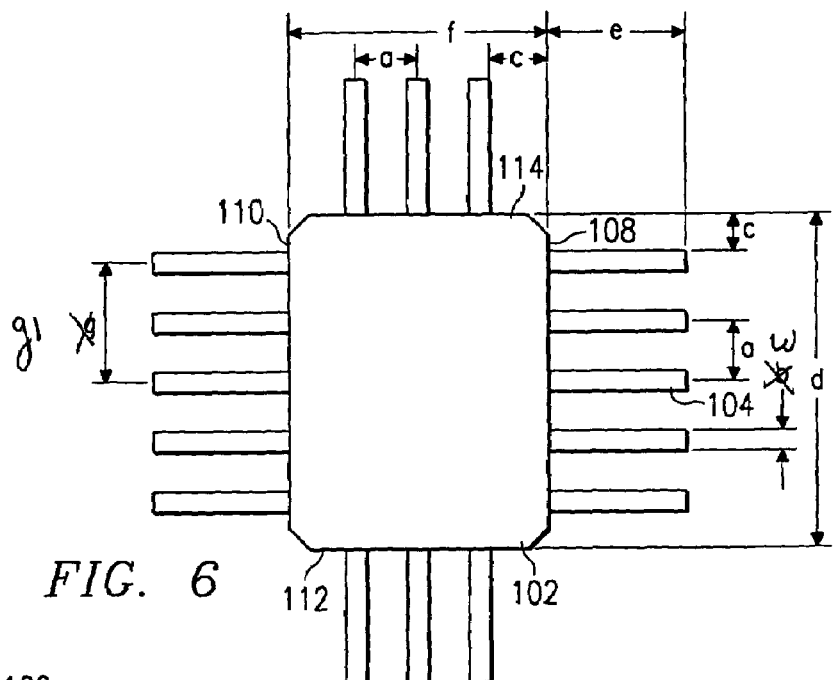
FIG. 6 is a lap view of an integrated circuit package with dimensions.

FIG. 6 illustrates the various dimensions of the body 102 and leads 104. By using the Pro/Engineer®, these dimensions may be placed on the object, for example, a lead frame of the package. These dimensions are labeled by the Pro/Engineer® so that further reference may be obtained. FIG. 6 illustrates the horizontal body length f as measured from vertical edge 108 to the other vertical edge 110. The length e of the lead 104 from the end of lead 104 to the body 102. The vertical body length d is the dimension from the horizontal edge 112 to the horizontal edge 114. Additionally, FIG. 6 illustrates the space allowance c from the horizontal edge 114 to the outside edge of the lead closest to the horizontal edge 114. The pitch a is from the center of a lead 104 to the center of an adjacent lead 104. The thickness b of the lead is from one longitudinal edge of the lead to another longitudinal edge of the lead. The dimension g1 is from the center of the package to the center of the outermost lead.

Figure 7:
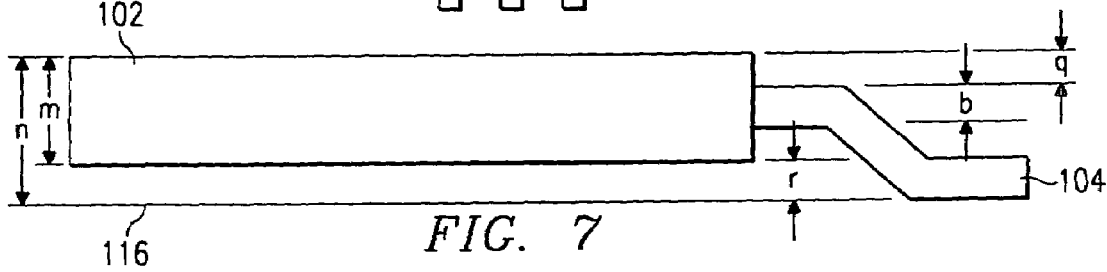
FIG. 7 is a side view of a fully designed integrated circuit, package with dimensions.

As illustrated in FIG. 7, the body thickness m of body 102 is measured from the bottom of the body 102 to the top of the body 102. The overall package thickness n is measured from the top of the body 102 to the surface 116 on which the leads have positioned the body 102. The plastic allowance q is the distance from the top of the lead 104 to the top of the body 102. The standoff r is measured from the bottom of the body 102 to the surface 116.

Figure 8:
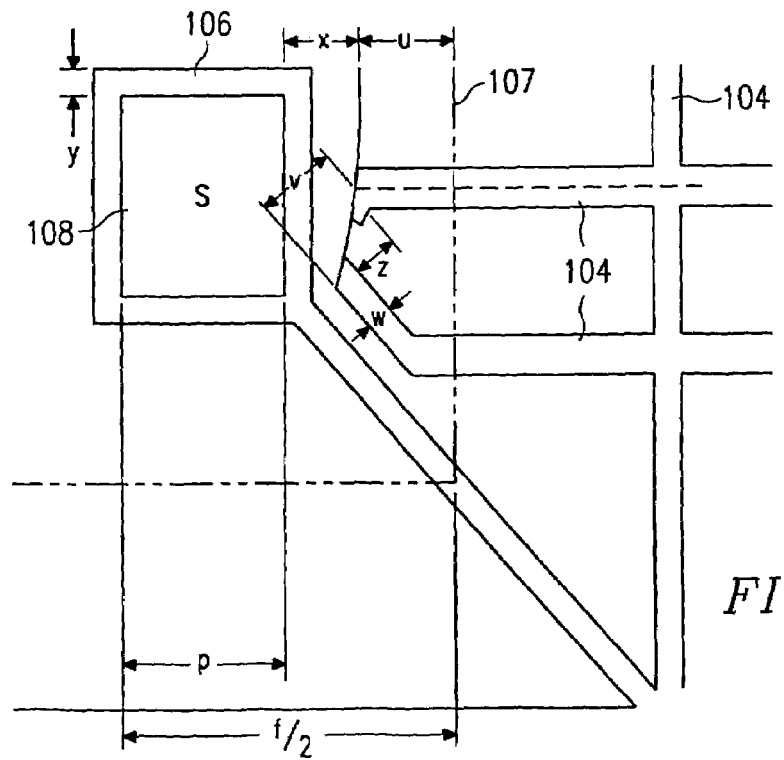
FIG. 8 is a partial top view of a partially designed lead frame for the integrated circuit package with dimensions.

FIG. 8 illustrates the die pad clearance y, which is the distance from the die pad to the integrated circuit chip 108. The die to lead clearance x is the distance from the die to the tip of the lead 104. A plastic body 107 is formed over the leads. The gap z is the distance between two leads. The two leads are still tied together on the lead frame thru the dam bar 109. Further, p is silicon chip size divided by 2 while y is the silicon chip to die pad clearance, and u is the minimum required amount of plastic overlap on the lead fingers 104.

Figure 21:
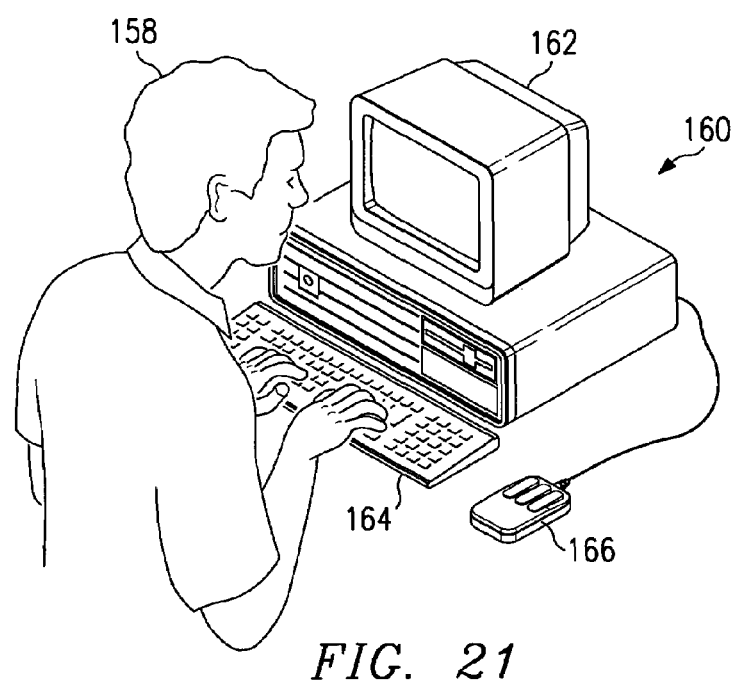
FIG. 21 is a perspective view of the invention.

A feature of the model developed using Pro/Engineer® is a relation file or database where these characteristics are stored. Control of these dimensions are accessed by the variables so that relationships between the dimensions may be established. Once these physical characteristics are established, the user 158 as illustrated in FIG. 21 may change the shape of the model by imposing constraints or boundary conditions on the modeled object. For example, the user 158 may impose the constraint or boundary conditions that the length be twice the width. In the relation file, this boundary condition would be d=2*f. Once this boundary condition is implemented, the height of the package would be twice the width of package as viewed by the user 158.

Other conditions may not be able to be satisfied, however, for example, if the boundary condition c=d were imposed, this could not be met because this would leave no room for the leads 104.

Thus, the present invention evaluates these boundary conditions before they are passed on to generate the graphical representation of model on the screen. One of these equations is that:

$$g \leq \frac{d}{2} - c,$$

where g=(NUMBER OF LEADS PER SIDE—1)*a. The user enters the (NUMBER OF LEADS) and a. If this boundary condition is not met, then an appropriate error message can be generated and viewed by the user 158 and the graphical display of the model is terminated. Another such equation is: $(n-1)*a \leq f-(c*2)-b$ where n=(NUMBER OF LEADS PER SIDE). If this relationship is not satisfied, an error message is generated and the model will not be generated for display. Another such relationship is $b \leq m-2*q$. Additionally, another such relationship is $r+m \leq n$.

Another such relationship is $$p + x \leq \frac{f}{2} - u.$$

Again, if these conditions are not satisfied, then an error message can be generated and the user will be informed of the violation in boundary conditions. Furthermore, the tip gap z must be greater than or equal to the minimum etch or stamping factor which is usually a predetermined value, for example 0.004 inches.

Another relationship is $$k = \frac{z}{w},$$

the ratio of lead tip width (w), to the gap (z) between two adjacent leads. The lead tip is calculated from a user inputs k and z. Dimension v is the amount of lead frame material required to make these leads $v \geq [w*(n+k(n-1))]/2$.

If any of the above relationship is violated, an error message is generated and written to the user while the program is halted.

Figure 9:
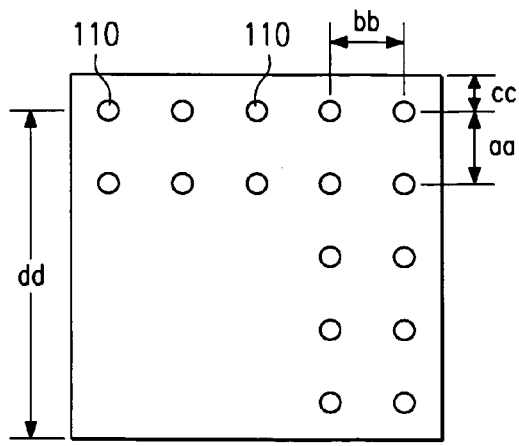
FIG. 9 is a top view of a quarter model of an integrated circuit package.

FIG. 9 illustrates another integrated circuit package.

Figure 10:
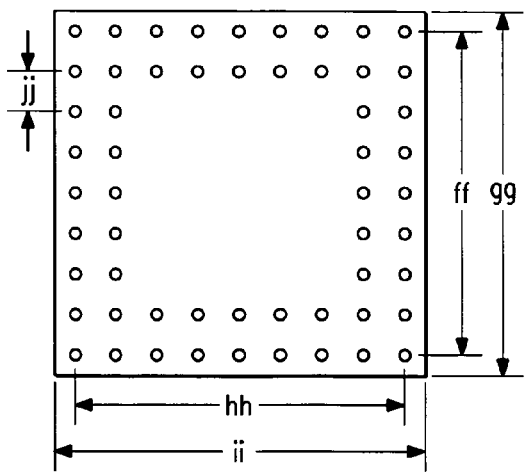
FIG. 10 is kip view of a full model of an integrated circuit package.
Figure 11:
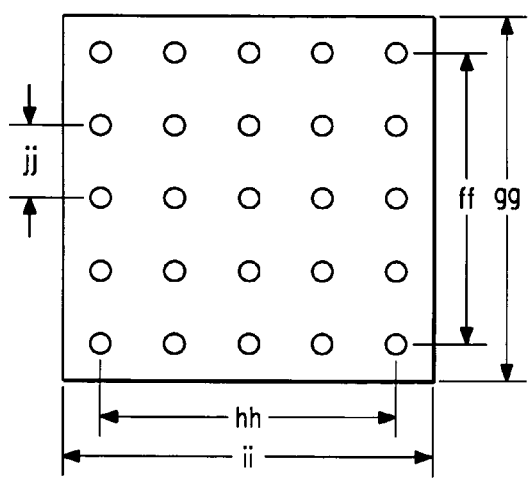
FIG. 11 is a top view of a full array of an integrated circuit package.

As illustrated in FIGS. 9, 10 and 11; aa is the distance between positions from one edge of the package, for example, along the vertical axis. Dimension cc is the distance between the edge of package and center of the feature. A typical representation of a position is 110, a round pin or lead. Number bb is the number of positions from another edge of the package, for example along the horizontal axis. Number ff is the number of positions in the vertical axis. The pitch jj is the distance between two positions. Number hh is the number of positions in the horizontal axis. The vertical distance gg is the distance from one edge to another. The horizontal distance hh is the distance from one edge to another in order to model these types integrated circuit designs, the models must satisfy the following equations: (ff−1)*jj≦gg−cc*2−feature size, where feature size is the dimension of the lead in this plane. This is a diameter of the pin in this example. Additionally, (hh−1)*jj≦ii−(cc*2)−feature size. At it additional equation is: no. of positions=ff*hh−(ff−2*aa)*(hh−2*bb).

If any one of these equations is violated, the error message is displayed and the model will not be constructed.

Figure 12:
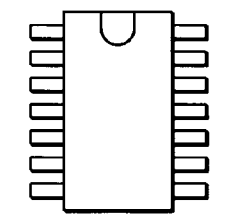
FIG. 12 is a top view of a Dual-Inline Plastic (DIP) package.
Figure 13:
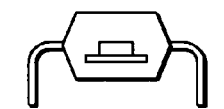
FIG. 13 is a side view of the DIP integrated circuit package.

FIGS. 12 through 20 illustrate various different types of package designs. FIGS. 12 and 13 illustrate a top and side and view respectively of a DIP package.

Figure 14:
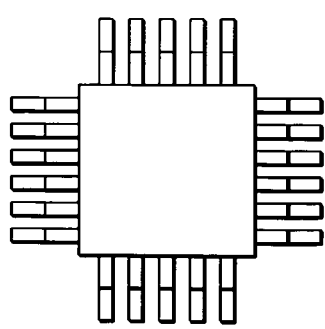
FIG. 14 is a top view of a quad flat pack.
Figure 15:
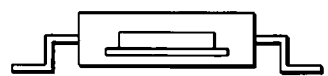
FIG. 15 is a side view of the quad flat pack.

FIGS. 14 and 15 illustrate a top and side view respectively of a quad flat package.

Figure 16:
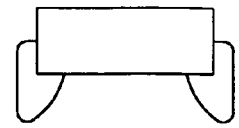
FIG. 16 is a side view of the Plastic Leaded Chip Carrier (PLCC) package.

FIG. 16 illustrates a side view of a PLCC pack.

Figure 17:
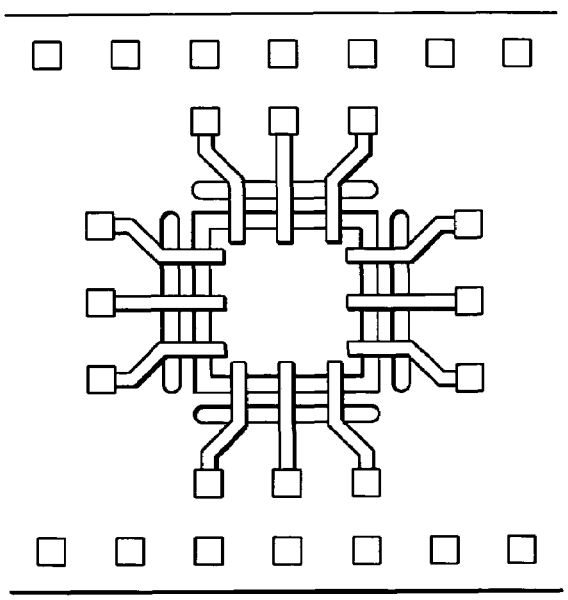
FIG. 17 is a top view of a Tape Automated Bonding (TAB) package.
Figure 18:
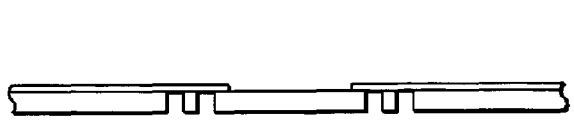
FIG. 18 is a side view of the TAE; package.

FIG. 17 and FIG. 18 illustrate a top and side view of a TAB integrated circuit package.

Figure 19:
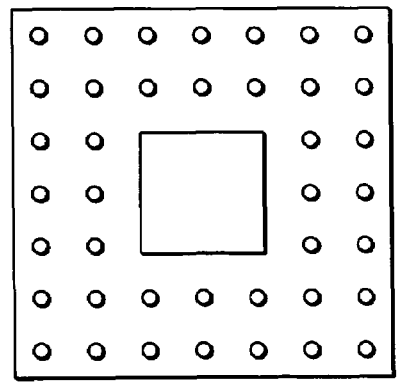
FIG. 19 is a bottom view of a pin grid array package.
Figure 20:
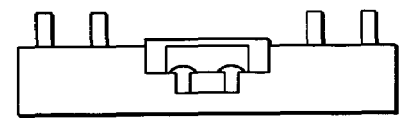
FIG. 20 is a side view of the pin grid array package.

FIGS. 19 and 20 illustrate a top and side view respectively of a pin grid array.

FIG. 21 illustrate a perspective view of a hardware embodiment for the Pro/Engineer® application of the present invention. The user 158 inputs and receives information, for example, the relationship or constraints to a workstation 160 having a monochrome or color monitor 162 and input devices such as keyboard 164 and a mouse 166. The workstation 160 may be able to operate a graphical windowing system such as X-windows. The workstation 160 is connected to a network in order to share the information stored in a memory of database with a plurality of users.

Thus, if any or all the constraints are violated, the constraint is not applied to the model and the model will not be generated with these constrains. Significant amount of time will be wasted by the user and the computer if these boundary conditions are not used to check the design before regenerating the solid model on the display.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. A machine for displaying an package having features corresponding to a package lead of the package for modeling, comprising:
    input circuitry to input commands from a user to model said package;
    altering circuitry to accept said commands from said user and to alter the position of the package lead of the package in accordance with said commands;
    dimension circuitry to form dimensions between said features;
    relation circuitry to form relations based on the lead between said features through said dimensions, wherein said relation circuitry compares said relations to determine an inconsistent relation based on the position of the package lead which prevents the package from being modeled.

2. A machine for displaying an object having features corresponding to a lead of the object for modeling, comprising:
    input circuitry to input commands from a user to model said object;
    altering circuitry to accept said commands from said user and to alter the position of the lead of the object in accordance with said commands;
    dimension circuitry to form dimensions between said features;
    relation circuitry to form relations based on the lead between said features through said dimensions, wherein said relation circuitry compares said relations to determine an inconsistent relation based on the position of the lead which prevents the object from being modeled,
    wherein a number of leads, g is:

$$g \leq \frac{d}{2} - c$$

where d is a length of a body of the object, c is space allowance from one edge of the object to an outside edge of the lead closest to said one edge.

3. A machine for displaying an object having features corresponding to a lead of the object for modeling, comprising:
    input circuitry to input commands from a user to model said object;
    altering circuitry to accept said commands from said user and to alter the position of the lead of the object in accordance with said commands;
    dimension circuitry to form dimensions between said features;
    relation circuitry to form relations based on the lead between said features through said dimensions, wherein said relation circuitry compares said relations to determine an inconsistent relation based on the position of the lead which prevents the object from being modeled,
    wherein (n−1)a≦f−(c*2)−b:
    where n is a number of leads per side;
    a is a pitch from a center of the lead of the object;
    f is a length of a body of the object from one side of the object to an opposite side of the object;
    c is a space allowance from one edge of the object; and
    b is a thickness of the lead of the object.

4. A machine for displaying an object having features corresponding to a lead of the object for modeling, comprising:
    input circuitry to input commands from a user to model said object;
    altering circuitry to accept said commands from said user and to alter the position of the lead of the object in accordance with said commands;
    dimension circuitry to form dimensions between said features;
    relation circuitry to form relations based on the lead between said features through said dimensions, wherein said relation circuitry compares said relations to determine an inconsistent relation based on the position of the lead which prevents the object from being modeled, wherein the object is a die having the lead, wherein:

$$p + x \leq \frac{f}{2} - u$$

where p is a measurement of a side of the object;
x is a clearance from the die to a tip of a lead;
f is a length of a body of the object; and
u is the minimum measurement of overlap of the body of the object.

5. A machine for displaying an object having features corresponding to a lead of the object for modeling, comprising:
input circuitry to input commands from a user to model said object;
altering circuitry to accept said commands from said user and to alter the position of the lead of the object in accordance with said commands;
dimension circuitry to form dimensions between said features;
relation circuitry to form relations based on the lead between said features through said dimensions, wherein said relation circuitry compares said relations to determine an inconsistent relation based on the position of the lead which prevents the object from being modeled,
wherein an amount of material, v is:

$$k = z + w$$

$$v \leq (w*(n+k*(n-1))) \div 2$$

where w is a width of the lead of the object;
n is a thickness of the object; and
z is a length of a gap between two adjacent leads of the object.

6. A machine for displaying an object having features corresponding to a lead of the object for modeling, comprising:
input circuitry to input commands from a user to model said object;
altering circuitry to accept said commands from said user and to alter the position of the lead of the object in accordance with said commands;
dimension circuitry to form dimensions between said features;
relation circuitry to form relations based on the lead between said features through said dimensions, wherein said relation circuitry compares said relations to determine an inconsistent relation based on the position of the lead which prevents the object from being modeled,
wherein (ff-1)*jj≦gg-cc*2
where ff is a number of positions along one side of the object;
jj is a distance between two positions of the object;
gg is a distance from one edge to another edge in a direction along an edge of the object; and cc is a distance between a center of a feature to the edge of the object.

7. A machine for displaying an object having features corresponding to a lead of the object for modeling, comprising:
input circuitry to input commands from a user to model said object;
altering circuitry to accept said commands from said user and to alter the position of the lead of the object in accordance with said commands;
dimension circuitry to form dimensions between said features;
relation circuitry to form relations based on the lead between said features through said dimensions, wherein said relation circuitry compares said relations to determine an inconsistent relation based on the position of the lead which prevents the object from being modeled,
wherein number of positions of the object is $$ff*hh-(ff-2*aa)*(hh-2*bb)$$

where ff is a number of positions along one side of the object;
hh is the number of positions along an edge of the object;
bb is the number of positions along another edge of the object;
aa is the number of positions from the edge in one direction.

8. A computer implemented method for displaying a package having features corresponding to a package lead of the package for modeling, comprising the steps of:
inputting commands from a user to model the package;
accepting said commands from said user to alter the position of the package lead of the package in accordance with said commands;
establishing dimensions between said features;
forming relations based on the lead between said features through said dimensions, wherein the step of forming relations includes the step of comparing said relations is to determine an inconsistent relation based on the position of the package lead which prevents the package from being modeled.

9. A computer implemented method for displaying an object having features corresponding to a lead of the object for modeling, comprising the steps of:
inputting commands from a user to model the object;
accepting said commands from said user to alter the position of the lead of the object in accordance with said commands;
establishing dimensions between said features;
forming relations based on the lead between said features through said dimensions, wherein the step of forming relations includes the step of comparing said relations is to determine an inconsistent relation based on the position of the lead which prevents the object from being modeled,
wherein the method further comprises the step of determining the number of leads, g by $$g \leq \frac{d}{2} - c$$

where d is a length of a body of the object, c is a space allowance from one edge of the object to an outside edge of the lead closest to said one edge.

10. A computer implemented method for displaying an object having features corresponding to a lead of the object for modeling, comprising the steps of:
inputting commands from a user to model the object;
accepting said commands from said user to alter the position of the lead of the object in accordance with said commands;

establishing dimensions between said features;
forming relations based on the lead between said features through said dimensions, wherein the step of forming relations includes the step of comparing said relations is to determine an inconsistent relation based on the position of the lead which prevents the object from being modeled,
wherein the method further comprises the step of determining $$(n-1)a \leq f-(c*2)-b$$

where n is a thickness of the object;
a is the pitch from the center of the lead of the object;
f is another length of a body of the object from one side of the object to an opposite side of the object;
c is a space allowance from one edge of the object; and
b is a thickness of the lead of the object.

11. A computer implemented method for displaying an object having features corresponding to a lead of the object for modeling, comprising the steps of:
inputting commands from a user to model the object;
accepting said commands from said user to alter the position of the lead of the object in accordance with said commands;
establishing dimensions between said features;
forming relations based on the lead between said features through said dimensions, wherein the step of forming relations includes the step of comparing said relations is to determine an inconsistent relation based on the position of the lead which prevents the object from being modeled,
wherein the method further comprises the step of determining $$p + x \leq \frac{f}{2} - u$$

where p is a measurement of a side of the object;
x is a clearance from a die of the object to a tip of the lead of the object;
f is a length of the body of the object; and
u is a minimum measurement of overlay of the body of the object.

12. A computer implemented method for displaying an object having features corresponding to a lead of the object for modeling, comprising the steps of:
inputting commands from a user to model the object;
accepting said commands from said user to alter the position of the lead of the object in accordance with said commands;
establishing dimensions between said features;
forming relations based on the lead between said features through said dimensions, wherein the step of forming relations includes the step of comparing said relations is to determine an inconsistent relation based on the position of the lead which prevents the object from being modeled,
wherein the method further comprises the step of determining an amount of material, v is:

$$k = z \div w$$

$$v \leq (w*(n+k*(n-1))) \div 2$$

where w is a width of the lead of the object;
n is a thickness of the object; and
z is a length of a gap between two adjacent leads of the object.

13. A computer implemented method for displaying an object having features corresponding to a lead of the object for modeling, comprising the steps of:
inputting commands from a user to model the object;
accepting said commands from said user to alter the position of the lead of the object in accordance with said commands;
establishing dimensions between said features;
forming relations based on the lead between said features through said dimensions, wherein the step of forming relations includes the step of comparing said relations is to determine an inconsistent relation based on the position of the lead which prevents the object from being modeled,
wherein the method further comprises the step of determining $$(f\!f-1)*j\!j \leq gg-cc*2$$

where ff is a number of positions along one side of the object;
jj is a distance between two positions of the object;
gg is a distance from one edge to another edge in a direction along an edge of the object; and
cc is a distance between a center of the feature to the edge of the object.

14. A computer implemented method for displaying an object having features corresponding to a lead of the object for modeling, comprising the steps of:
inputting commands from a user to model the object;
accepting said commands from said user to alter the position of the lead of the object in accordance with said commands;
establishing dimensions between said features;
forming relations based on the lead between said features through said dimensions, wherein the step of forming relations includes the step of comparing said relations is to determine an inconsistent relation based on the position of the lead which prevents the object from being modeled,
wherein the method further comprises the step of determining:

$$f\!f*hh-(f\!f-2*aa)*(hh-2*bb)$$

where ff is a number of positions along one side of the object;
hh is a number of positions along an edge of the object;
bb is a number of positions along another edge of the object;
aa is a number of positions from the edge in one direction.

* * * * *